(12) United States Patent
Yu (10) Patent No.: US 11,942,732 B2
(45) Date of Patent: Mar. 26, 2024

(54) ELECTRICAL CONNECTOR AND ELECTRICAL CONNECTOR ASSEMBLY

(71) Applicant: ALLTOP TECHNOLOGY CO., LTD., New Taipei (TW)

(72) Inventor: Wangi Yu, New Taipei (TW)

(73) Assignee: ALLTOP TECHNOLOGY CO., LTD., New Taipei (TW)

( * ) Notice: Subject to any disclaimer, the term of this patent is extended or adjusted under 35 U.S.C. 154(b) by 66 days.

(21) Appl. No.: 17/579,589

(22) Filed: Jan. 19, 2022

(65) Prior Publication Data

US 2023/0076234 A1 Mar. 9, 2023

(30) Foreign Application Priority Data

Sep. 3, 2021 (TW) .................................. 110132781
Sep. 3, 2021 (TW) .................................. 110210427

(51) Int. Cl.
*H01R 13/66* (2006.01)
*H01R 12/77* (2011.01)

(52) U.S. Cl.
CPC ....... *H01R 13/6658* (2013.01); *H01R 12/771* (2013.01)

(58) Field of Classification Search
CPC ............. H01R 13/6608; H01R 13/405; H01R 13/6683; H01R 13/424; H01R 4/185; H01R 13/6658; H01R 12/771; G01K 1/08; G01K 7/22
USPC ............................... 439/620.21, 620.22, 936
See application file for complete search history.

(56) References Cited

U.S. PATENT DOCUMENTS

| 4,464,005 A * | 8/1984 | Dwight | H01R 12/75 439/485 |
|---|---|---|---|
| 5,949,324 A * | 9/1999 | Segler | G01K 7/22 374/E7.028 |
| 7,563,127 B2 * | 7/2009 | Kurahashi | H01R 13/6608 439/620.08 |
| 2010/0254428 A1 * | 10/2010 | Rose | G01K 7/16 374/183 |
| 2016/0104978 A1 * | 4/2016 | Chaumeny | G01K 1/16 439/620.21 |
| 2016/0111831 A1 * | 4/2016 | Kawai | H01R 13/04 439/620.21 |
| 2019/0386419 A1 * | 12/2019 | Matsunaga | H01R 13/405 |
| 2019/0386437 A1 * | 12/2019 | Matsunaga | H01R 13/405 |
| 2020/0279706 A1 * | 9/2020 | Gengenbach | H01R 13/7137 |

* cited by examiner

*Primary Examiner* — Gary F Paumen
(74) *Attorney, Agent, or Firm* — Cheng-Ju Chiang (57) ABSTRACT

An electrical connector includes an insulative housing, a pair of contacts accommodated in the insulative housing and a temperature sensing element electrically connected with the contacts. The insulative housing defines a base portion and a receiving portion extending forwards from the base portion, the receiving portion has a cavity opening towards one side thereof. Each contact defines a retaining portion held in the base portion, a contacting arm provided at one end of the retaining portion and protruding into the cavity, and a mating arm provided at the opposite end of the retaining portion. The temperature sensing element is at least partially received in the cavity and connecting with the contacting arm of the contact in the cavity.

16 Claims, 13 Drawing Sheets

ELECTRICAL CONNECTOR AND ELECTRICAL CONNECTOR ASSEMBLY

CROSS REFERENCE TO RELATED APPLICATIONS

The present application claims the priority of Taiwan Patent Application No. 110132781 filed on Sep. 3, 2021, and Taiwan Patent Application No. 110210427 filed on Sep. 3, 2021, the contents of which are hereby incorporated by reference into this application.

BACKGROUND

1. Technical Field

The present disclosure relates to an electrical connector and an electrical connector assembly, and more particularly to an electrical connector and an electrical connector assembly which are convenient to disassemble and replace.

2. Description of Related Art

In the thermal management system of traditional BMS battery management module of new energy vehicles, a temperature sensor used to detect the temperature is usually fixed on a printed circuit board (PCB) or a flexible printed circuit/flexible flat cable (FPC/FFC) by welding. When the temperature sensor in an abnormal condition, an entire battery pack needs to be disassembled for replacement, which is a relatively difficult operation and may cause damage to corresponding components and require recalibration.

It is desirable to provide an improved electrical connector and an improved electrical connector assembly for solving above problems.

SUMMARY

In one aspect, the present invention includes a data transmission cable comprising an insulative housing, a pair of contacts accommodated in the insulative housing and a temperature sensing element electrically connected with the contacts. The insulative housing defines a base portion and a receiving portion extending forwards from the base portion, the receiving portion has a cavity opening towards one side thereof. Each contact defines a retaining portion held in the base portion, a contacting arm provided at one end of the retaining portion and protruding into the cavity, and a mating arm provided at the opposite end of the retaining portion. The temperature sensing element is at least partially received in the cavity and connecting with the contacting arm of the contact in the cavity.

An electrical connector assembly of the disclosure includes an electrical connector and a connecting element electrically connected with mating arms of the electrical connector. The electrical connector comprises an insulative housing, a pair of contacts accommodated in the insulative housing and a temperature sensing element electrically connected with the contacts. The insulative housing defines a base portion and a receiving portion extending forwards from the base portion, the receiving portion has a cavity opening towards one side thereof. Each contact defines a retaining portion held in the base portion, a contacting arm provided at one end of the retaining portion and protruding into the cavity, and a mating arm provided at the opposite end of the retaining portion. The temperature sensing element is at least partially received in the cavity and connecting with the contacting arm of the contact in the cavity.

An electrical connector assembly of the disclosure includes at least one temperature sensing connector, the temperature sensing connector comprises an insulative housing, a pair of contacts retained in the insulative housing and a temperature sensing element electrically connected with the contacts. The insulative housing has a pair of receiving slots for receiving the corresponding contacts. Each contact has a retaining portion received in corresponding receiving slot, a contacting arm provided at one end of the retaining portion and a mating arm provided at the opposite end of the retaining portion.

The invention has the advantages that: In the electrical connector and electrical connector assembly, the temperature sensing element is at least partially received in the cavity of the insulative housing, and connecting with the contacting arm of the contact in the cavity, thereby facilitating disassembly and replacement of the faulty temperature sensing element.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

The components in the drawing are not necessarily drawn to scale, the emphasis instead being placed upon clearly illustrating the principles of the described embodiments. In the drawings, reference numerals designate corresponding parts throughout various views, and all the views are schematic.

DETAILED DESCRIPTION OF THE ILLUSTRATED EMBODIMENT

Reference will now be made to the drawing figures to describe the embodiments of the present disclosure in detail. In the following description, the same drawing reference numerals are used for the same elements in different drawings.

Figure 1:
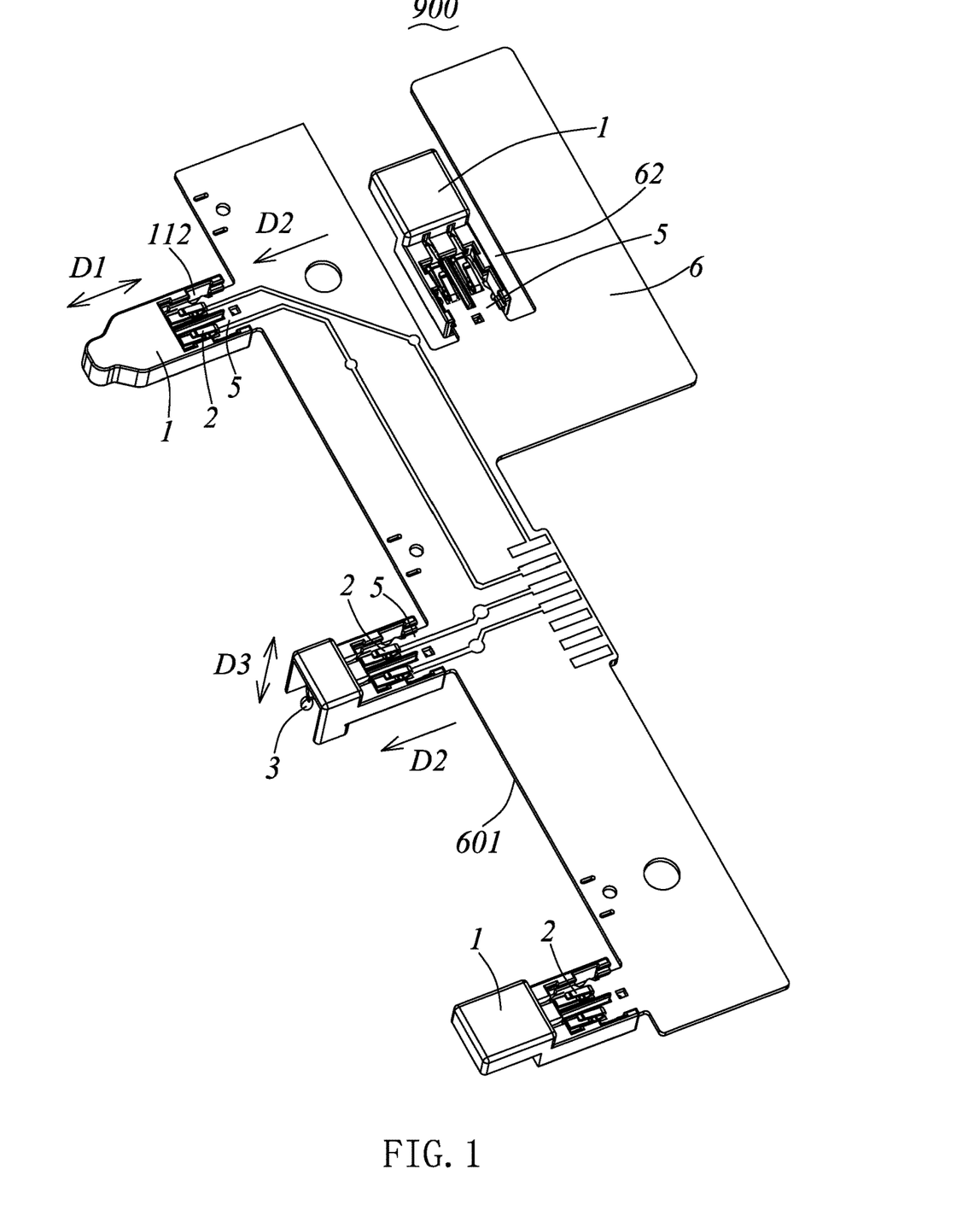
FIG. 1 is a perspective view of an electrical connector assembly in accordance with a first embodiment of the present disclosure.
Figure 2:
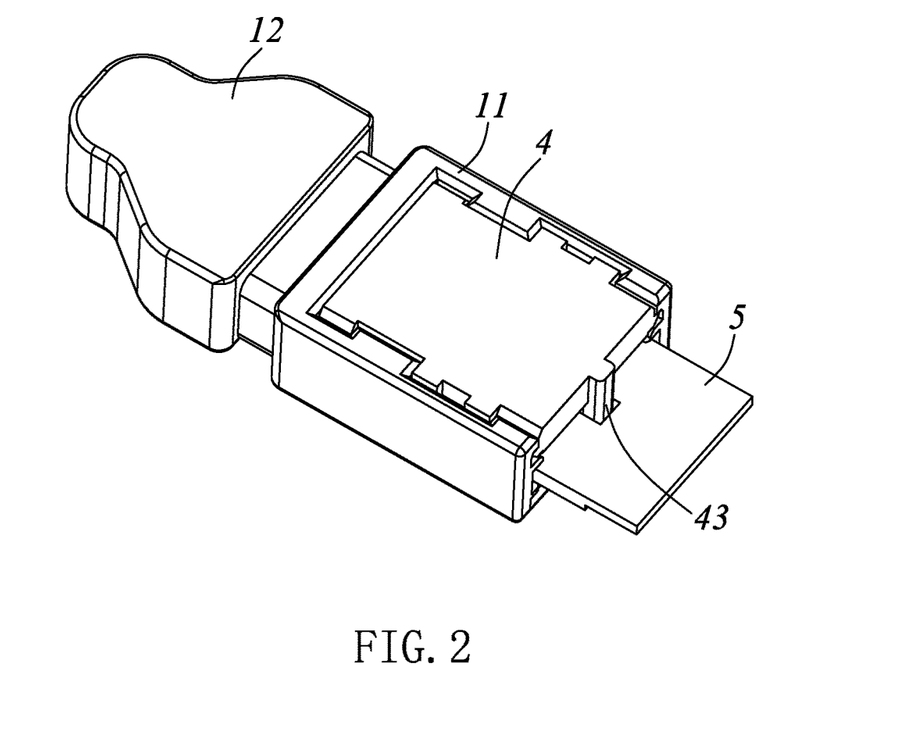
FIG. 2 is a perspective view of an electrical connector and a connecting element of the electrical connector assembly shown in FIG. 1.

Referring to FIG. 1, the present disclosure relates to an electrical connector assembly 900 comprising at least one electrical connector, and the electrical connector is a temperature sensing connector. As shown in FIG. 1, the electrical connector assembly 900 comprises a plurality of temperature sensing connectors, each temperature sensing connector comprises an insulative housing 1, a pair of contacts 2 and a temperature sensing element 3 electrically connected with the contacts 2. The electrical connector assembly 900 further has a plurality of connecting elements 5 electrically connected in correspondence with the temperature sensing connectors.

Referring to FIGS. 2 to 9, the electrical connector in a preferred embodiment and a connecting element 5 are shown, and a detailed illustration is as follow.

The insulative housing 1 defines a base portion 11 and a receiving portion 12 extending forwards from the base portion 11, the receiving portion 12 is provided with a cavity 120 opening towards one side thereof. Specially, the receiving portion 12 has a partition 121 located in the cavity 120 and a pair of restriction slots 123 arranged on both sides of the partition 121. Each restriction slot 123 is formed by the partition 121 and a projection 124 located on an outside of the partition 121 at intervals.

The base portion 11 has an open portion 112 opening outward and towards one side in a height direction thereof, specially, the base portion 11 comprises a pair of side walls 113 opposite to each other and a bottom wall 114 connecting the pair of side walls 113, the pair of side walls 113 are connected with the bottom wall 114 to form the open portion 112, and the open portion 112 is opening towards a rear side of the base portion 11. Each side wall 113 has a pair of engaging slots 1131 recessing outwardly from an inner surface thereof and a first latching slot 1132 communicated with the engaging slot 1131 on a front side.

The base portion 11 further has a separating wall 115 protruding upwards from the bottom wall 114, and the separating wall 115 is located between the pair of side walls 113 in a transverse direction. The separating wall 115 defines an upper segment 1151 and a lower segment 1152, the lower segment 1152 has a greater width in the transverse direction than the upper segment 1151 in the transverse direction. The lower segment 1152 has a recessed portion 1153 recessing forward from a rear end surface thereof and an upper wall 1154 immediately adjacent to the recessed portion 1153.

The insulative housing 1 has a pair of receiving slots 13 for receiving the corresponding contacts 2 and a pair of mounting slots 14 communicated with corresponding receiving slots 13, the insulative housing 1 further has a pair of second latching slots 15 on an upper side of relative mounting slot 14, each second latching slot 15 is recessed in corresponding side wall 113 and extending forward from a rear surface of the insulative housing 1.

Each contact 2 has a retaining portion 21 held in the base portion 11, a contacting arm 23 provided at one end of the retaining portion 21 and protruding into the cavity 120, and a mating arm 24 provided at the opposite end of the retaining portion 21, the mating arm 24 defines a mating portion 241 protruding downwards.

In addition, each contact 2 further defines an abutting arm 25 extending in a reversed direction from the mating arm 24, thus the abutting arm 25 is located on an upper side of the mating arm 24 and connected with the mating arm 24 to form a U-shape configuration. When a cover 4 covering the open portion 112 from an upper side thereof, the cover 4 is abutting against the abutting arm 25 and therefore the mating portion 241 of the mating arm 24 having a tendency to move downwards.

Moreover, each contact 2 further has a clamping arm 26 extending from the retaining portion 21, the clamping arm 26 extends rearwardly from the retaining portion 21 and is curved and elastic, the mating arm 24 is also curved and elastic.

Furthermore, in this embodiment, the retaining portion 21 is of U-shaped, and comprises a pair of retaining plates 212 spaced apart from each other and opposite to each other along the height direction, the mating arm 24 and the clamping arm 26 are extending backwards from the corresponding retaining plates 212. In this way, the connecting element 5 is sandwiched between the clamping arm 26 and the mating arm 24, and clamped at an upper side and a lower side thereof by means of elastic clamping forces to ensure the reliability of an electrical connection of the connecting element 5.

The retaining portion 21 is provided with a closed side on one side and an open side on the other side in the transverse direction, and each retaining plate 212 defines a plurality of barbs 2121 on the open side thereof, and the barbs 2121 are interfering with the insulative housing 1.

In further, the clamping arm 26 has a clamping portion 261 arched upwards to give it elastic deformability, and the clamping portion 261 presses against the connecting element 5 on the lower side thereof when the connecting element 5 is inserted into the insulative housing 1. The clamping arm 26 further has a tail portion 262 located at a rear end and a limiting portion 263 protruding from the tail portion 262 in the transverse direction, the limiting portion 263 of one clamping arm 26 extends into the recessed portion 1153 in the separating wall 115, and the limiting portion 263 of the other clamping arm 26 extends into a recessed portion in one side wall 113.

Figure 3:
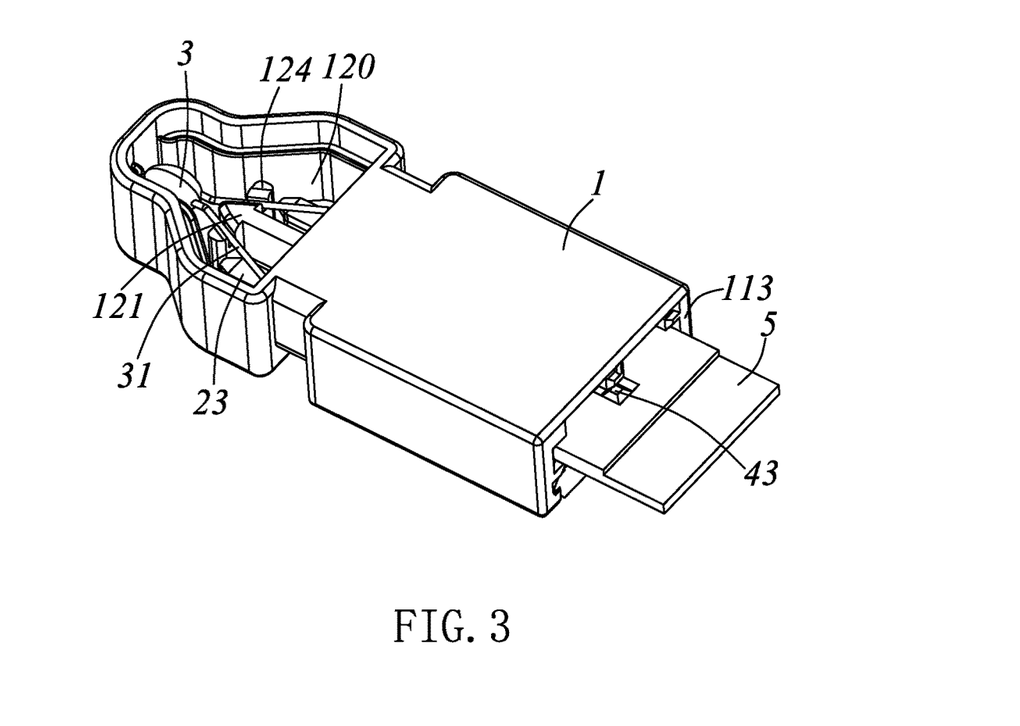
FIG. 3 is a view similar to FIG. 2, but viewed from another aspect.
Figure 4:
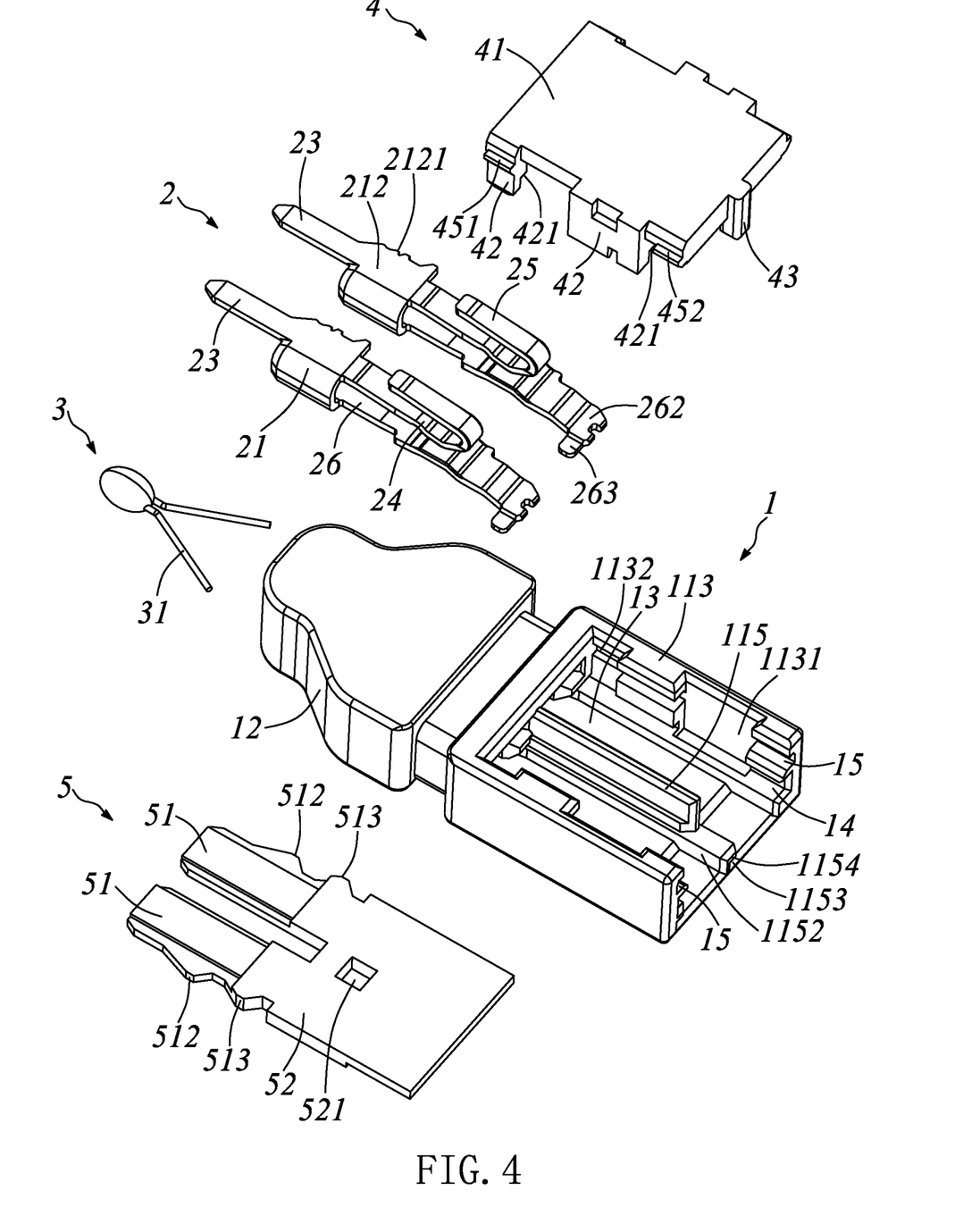
FIG. 4 is an exploded view of the electrical connector and the connecting element shown in FIG. 2.
Figure 5:
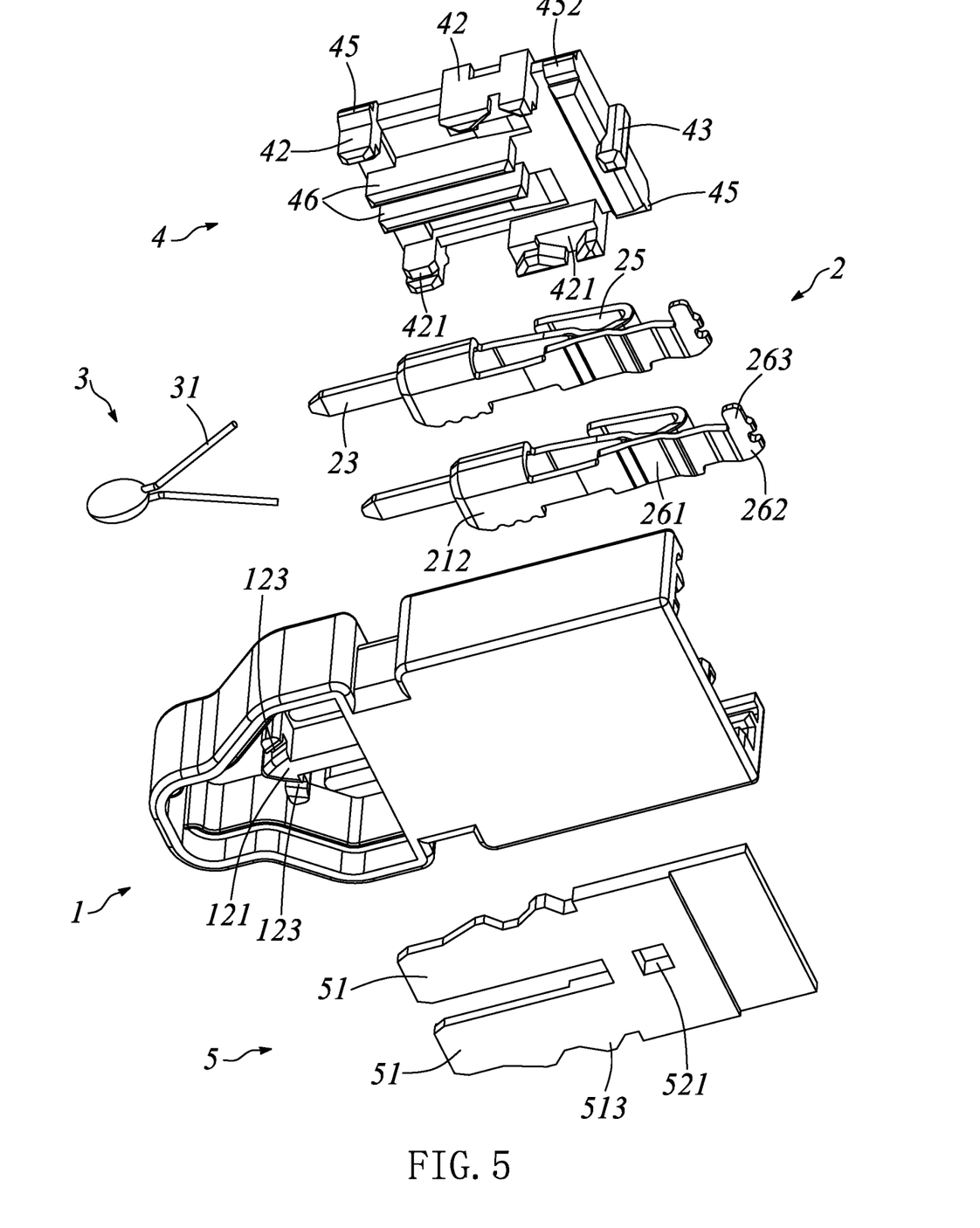
FIG. 5 is a view similar to FIG. 4, but viewed from another aspect.
Figure 6:
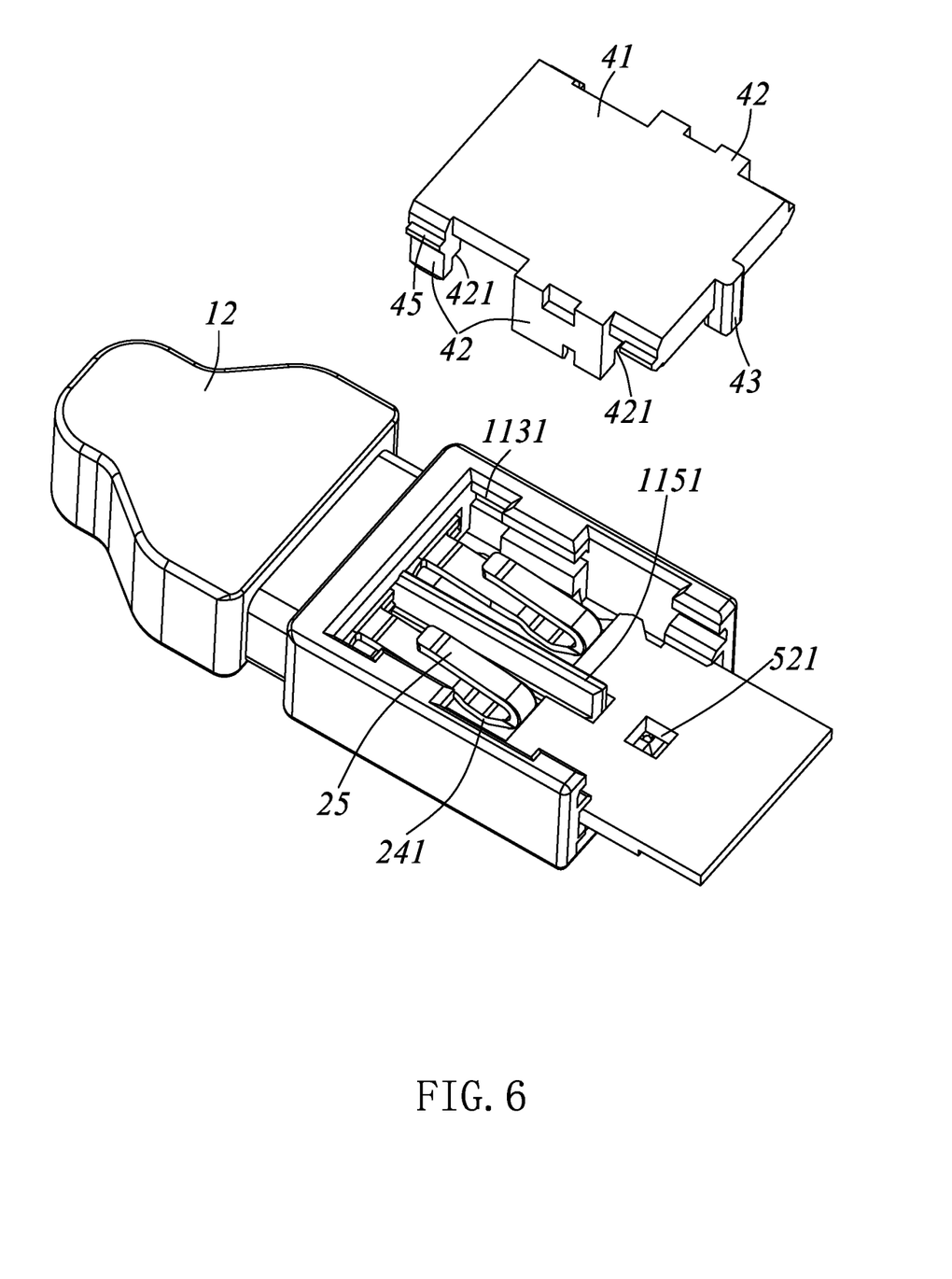
FIG. 6 is a partially assembled view of the electrical connector and the connecting element shown in FIG. 4.
Figure 9:
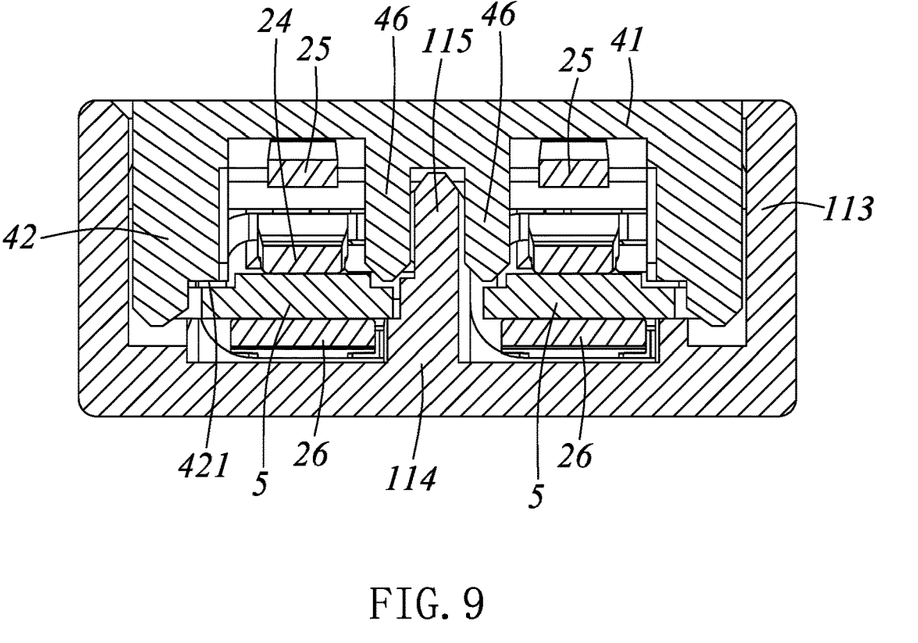
FIGS. 9-10 are cross-sectional views of the electrical connector assembly shown in FIG. 1.
Figure 10:
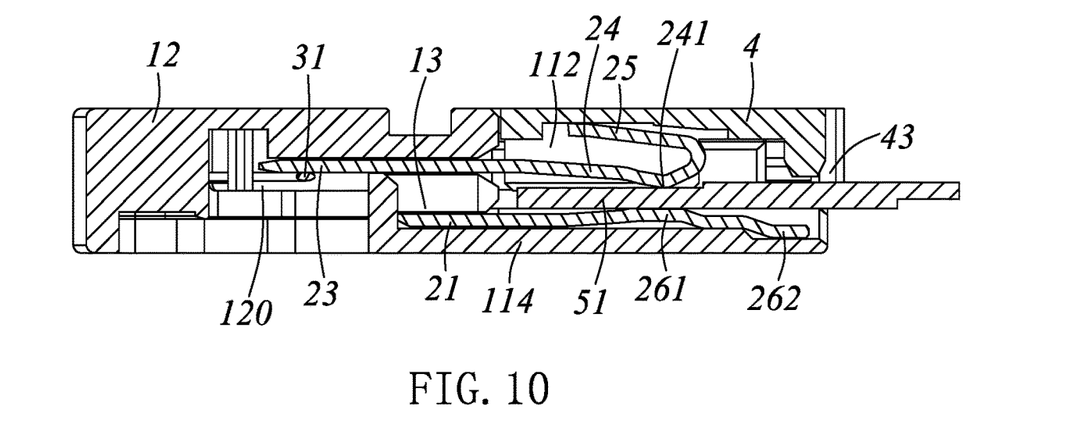

Referring to FIGS. 3-5, and conjunction with FIG. 9, the temperature sensing element 3 is at least partially accommodated in the cavity 120 and connected to the contacting arms 23 of the contacts 2 within the cavity 120. Further, the temperature sensing element 3 has a pair of pins 31 confined in corresponding restriction slots 123 to be soldered with corresponding contacting arms 23.

Please referring to FIGS. 2, 4-7 and FIGS. 9-10, the electrical connector further has the cover 4 assembled to the open portion 112, the cover 4 at least partially covers the contacts 2.

The cover 4 has a main portion 41 and a plurality of stopping blocks 42 provided at edges of the main portion 41, each stopping block 42 extends downwardly from the edge of the main portion 41 to make its bottom surface be located on an underside of a bottom surface of the main portion 41. Furthermore, the stopping blocks 42 are disposed on both sides of the cover 4 in the transverse direction, and held in corresponding engaging slots 1131. Each side of the stopping blocks 42 comprise at least one side stopping portion 421 facing downwards.

The cover 4 further has a rear stopping portion 43 protruding downwardly from a rear edge of the main portion 41, the rear stopping portion 43 extends downwards beyond the bottom surface of the main portion 41.

In the present invention, the cover 4 is locked with the insulative housing 1, the cover 4 and the insulative housing cover and secure the contacts 2 on both sides. In a preferable embodiment of the present invention, the cover 4 is assembled to the insulative housing 1 along the height direction and fastened to the side walls 113 of the base portion 11 by means of locking portions 45 on both sides thereof.

At least one of the stopping blocks 42 on each side of the cover 4 in the transverse direction has a first locking portion 451, in the illustrated embodiment, the first locking portion 451 is provided on an outside of the stopping block 42 located at the front.

The main portion 41 has a pair of second locking portions 452 on both sides thereof in the transverse direction, the pair of second locking portions 452 are arranged on a rear side of the stopping blocks 42 which are located at the back, and a protruding length of each second locking portion 452 toward outwards in the transverse direction is shorter than a protruding length of the adjacent stopping block 42 toward outwards in the transverse direction, so that an outer surface of the stopping block 42 is far away from a lateral surface of the main portion 41 in comparison to the second locking portion 452. The first and second locking portions 451, 452 are collectively referred to as the locking portions 45, the first locking portions 451 are latched in the first latching slots 1132 to avoid relative movement of the cover 4 in the height direction on the front side, and the second locking portions 452 is positioned in the second latching slots 15 to avoid relative movement of the cover 4 in the height direction on the rear side.

The cover 4 further has a pair of positioning walls 46 protruding downwards from the main portion 41, the pair of positioning walls 46 are spaced apart from each other in the transverse direction and located in a central position of the cover 4, each positioning wall 46 extends in a front-and-back direction. The separating wall 115 is located in a space formed between the pair of positioning walls 46 for alignment and placement.

The electrical connector further has an insulator (not shown) accommodated in the insulative housing 1 and enclosing on the temperature sensing element 3, the insulator is enclosing on a conjunction area between the temperature sensing element 3 and the contacts 2. In this embodiment, the temperature sensing element 3 is completely received in the cavity 120, the pair of pins 31 are connected with the contacting arms 23 of the contact 2, the insulator is filled in the cavity 120 and enclosing the temperature sensing element 3 and connection parts of the contacting arms 23 therein.

The connecting element 5 is electrically connected to the mating arm 24 of the electrical connector, when connected, the connecting element 5 is inserted into the mounting slots 14 along a back-to-front direction and abutting against the mating portion 241 of the mating arm 24.

In the present invention, the connecting element 5 has a pair of mating tongues 51 arranged side by side in the transverse direction and electrically connected with corresponding contacts 2. The mating tongues 51 are inserted into corresponding mounting slots 14 and separated from each other by the separating wall 115 in the base portion 11, the mating tongues 51 are abutting against between the insulative housing 1 and the contacts 2.

Each mating tongues 51 defines a first protruding portion 512 and a second protruding portion 513 disposed on one side in the transverse direction, the second protruding portion 513 is located behind the first protruding portion 512, the side stopping portion 421 of the stopping blocks 42 on a front side restricts the first protruding portion 512 from an upper side thereof, the second protruding portion 513 is accommodated in a concave portion 423 and stopped by the side stopping portion 421 on a same side, the concave portion 423 is formed at a bottom side of the stopping block 42 on a rear side.

The connecting element 5 further has a tabulate portion 52 behind the pair of mating tongues 51, the tabulate portion 52 is provided with a fixing hole 521 penetrating through it in the height direction, the rear stopping portion 43 extends downwardly into the fixing hole 521 to achieve a fixation on a rear side of the mating tongues 51.

Figure 7:
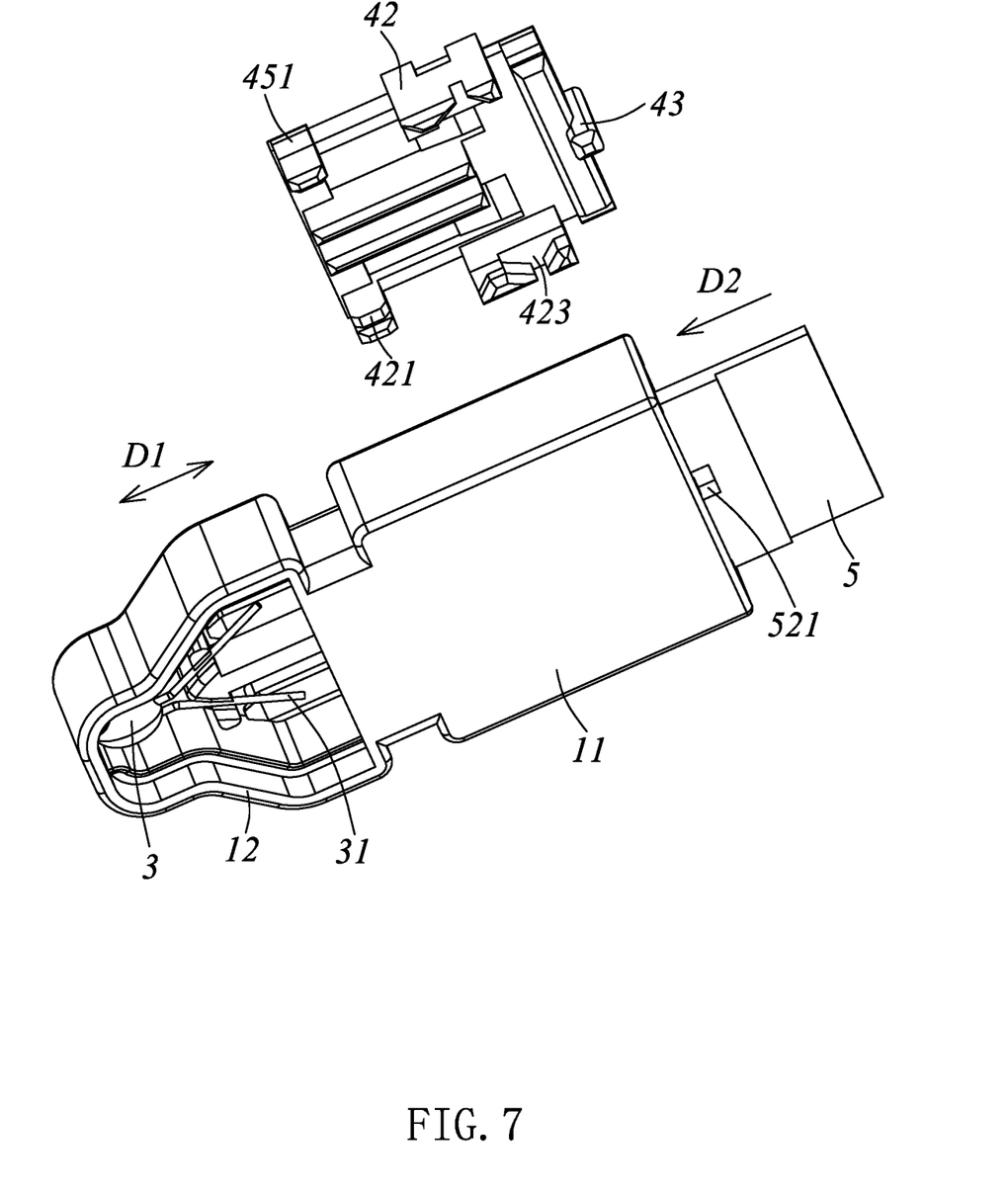
FIG. 7 is a view similar to FIG. 6, but viewed from another aspect.
Figure 8:
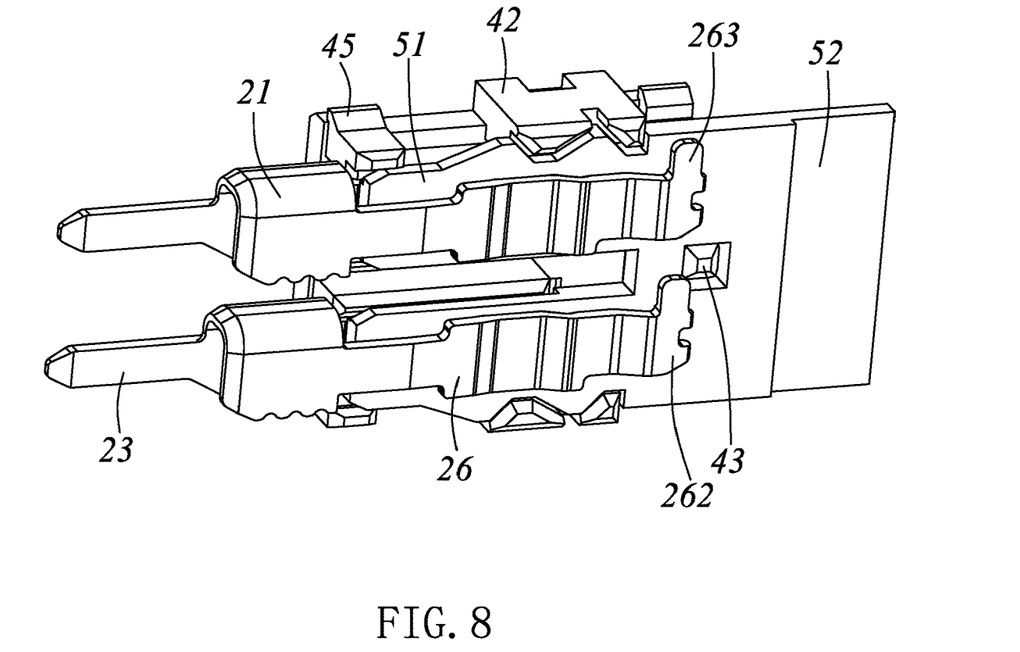
FIG. 8 is a perspective view of the electrical connector and the connecting element shown in FIG. 2 when an insulative housing and a temperature sensing element removed away.

As shown in FIG. 7, the temperature sensing element 3 is placed in a direction D1 parallel to an insertion direction D2 of the connecting element 5. Specifically, the placement direction D1 of the temperature sensing element 3 is parallel to a plane in which the pair of pins 31 located, and is in a front-to-back direction of the electrical connector, the insertion direction D2 is also in the back-to-front direction of the electrical connector.

Figure 11:
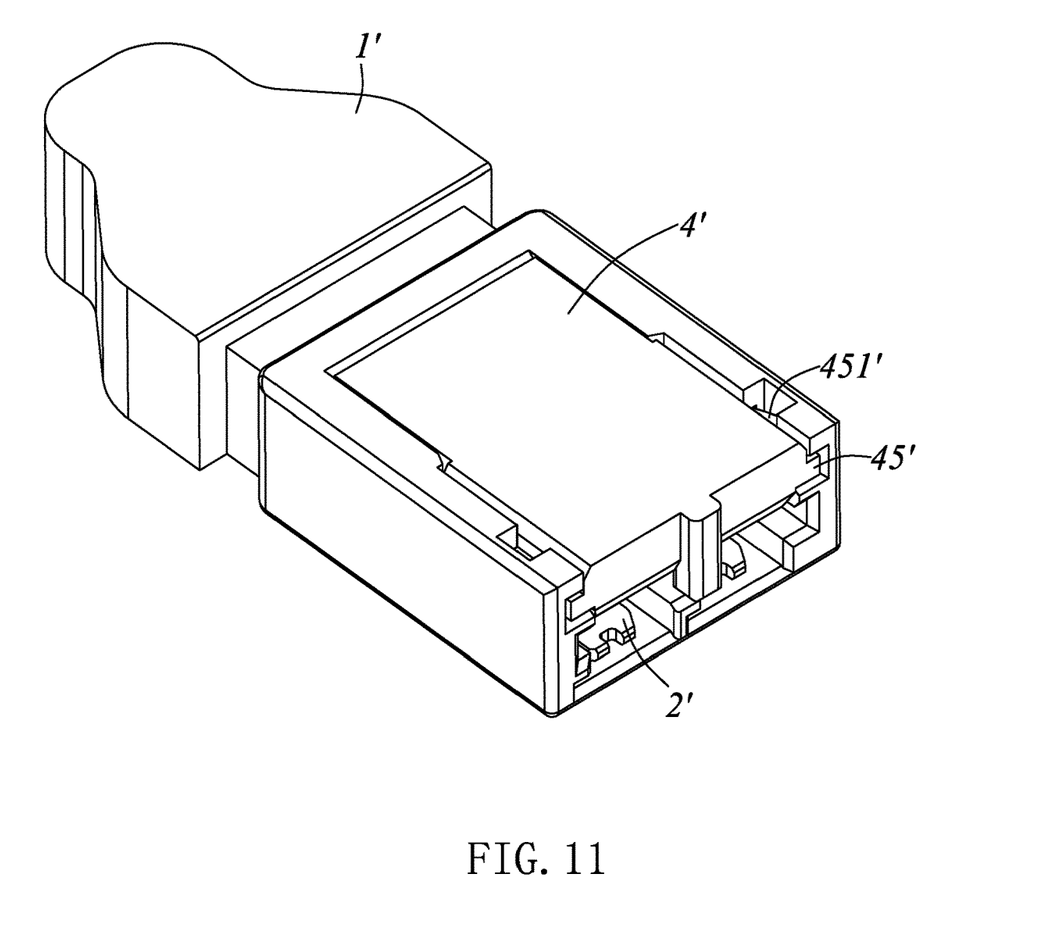
FIG. 11 is a perspective view of another electrical connector in accordance with another embodiment of the present disclosure.
Figure 12:
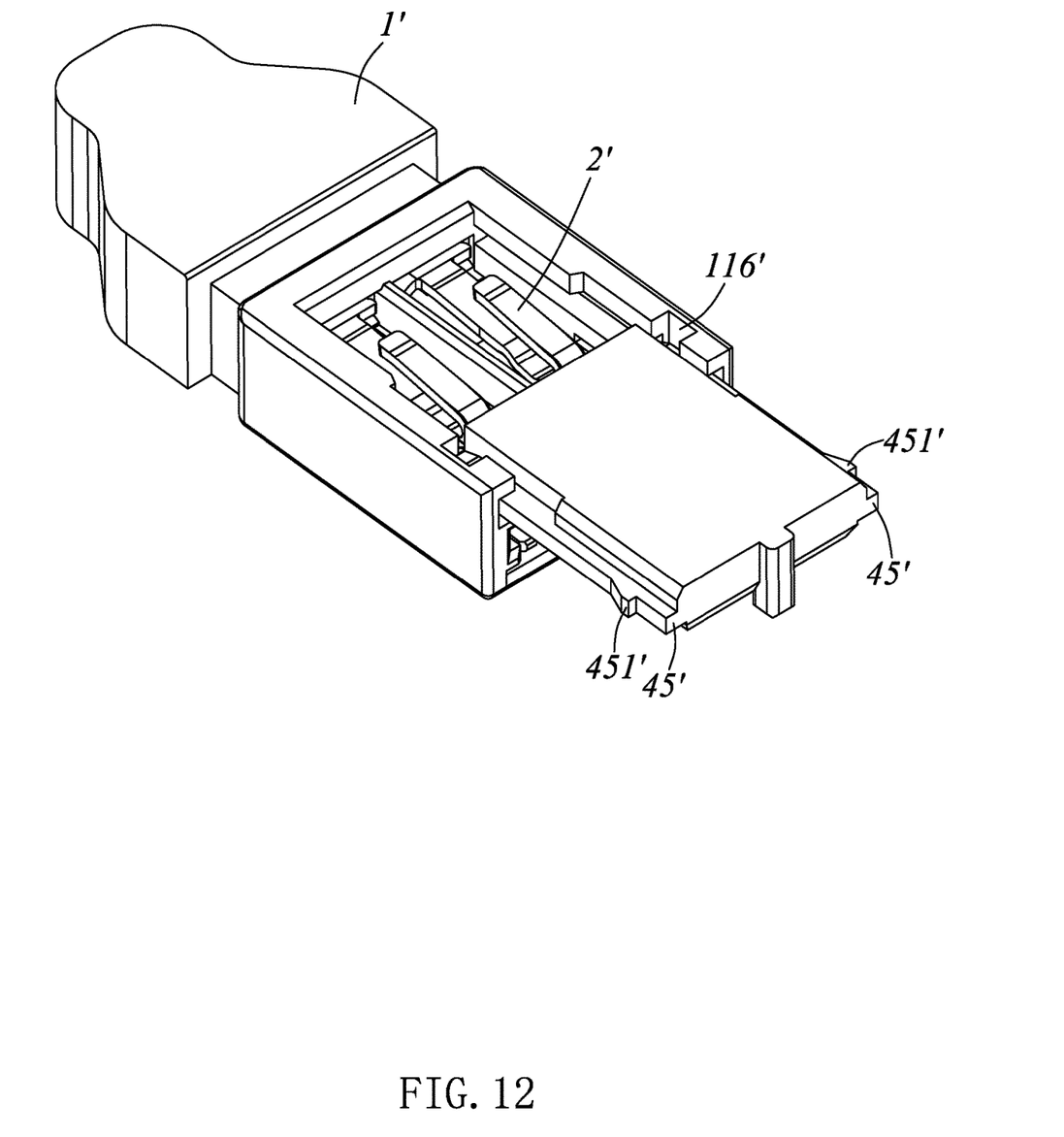
FIG. 12 is a perspective view of the electrical connector shown in FIG. 11 when a cover is not fully assembled.
Figure 13:
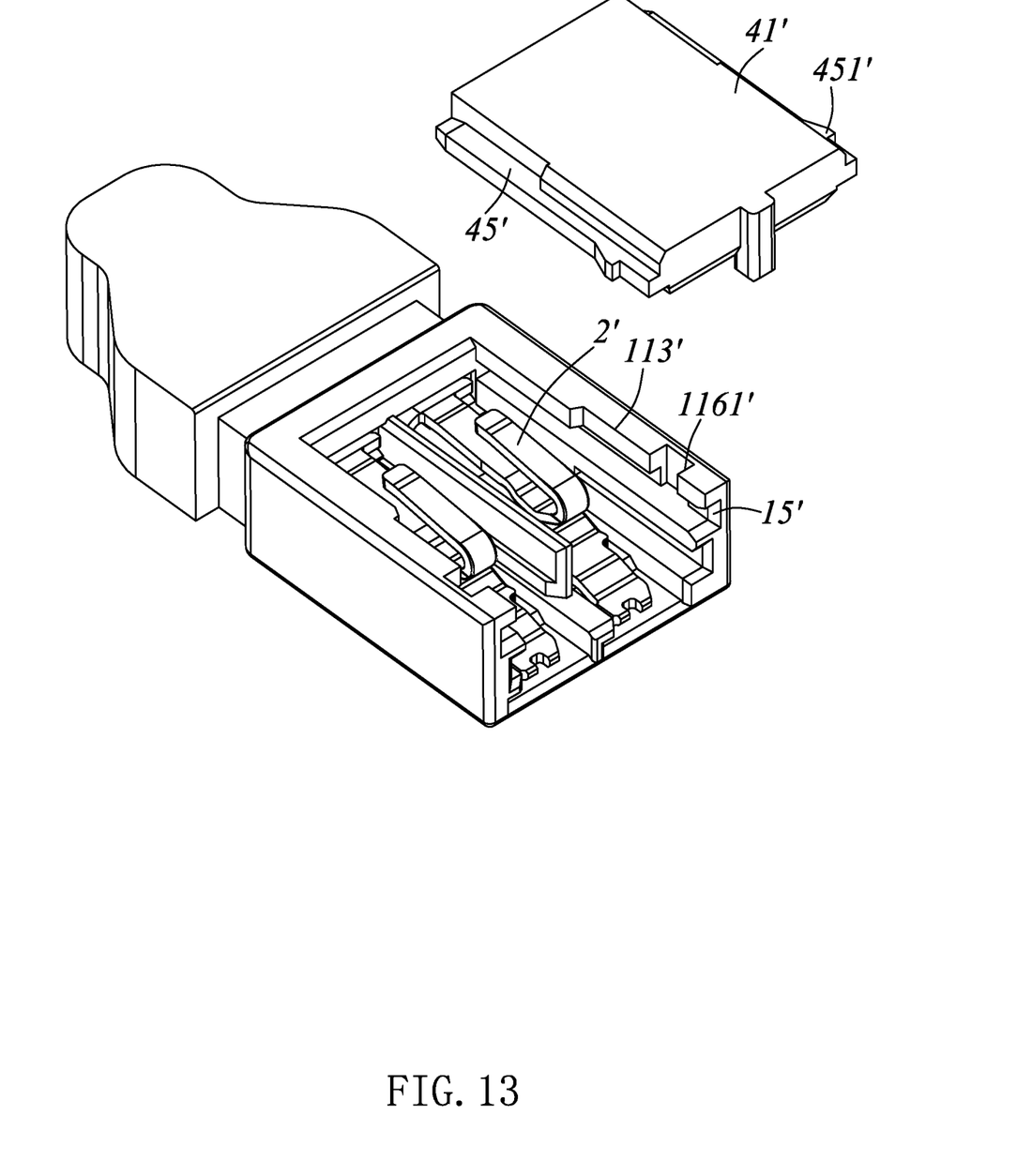
FIG. 13 is a partially exploded view of the electrical connector shown in FIG. 11.

Next referring to FIGS. 11 to 13, description will be made of an electrical connector according to another embodiment of the present invention. The electrical connector is substantially similar to the electrical connector in aforementioned embodiment, and also comprises an insulative housing 1', a pair of contacts 2', a temperature sensing element (not shown) electrically connected with the contacts 2' and a cover 4' assembled to the insulative housing 1'. The difference is only detailed structure of the cover 4' and an engagement between the cover 4' and the insulative housing 1', and detailed description for the difference is as follows.

In this embodiment, the cover 4' is slidingly assembled to the insulative housing 1' in a front-and-back direction, one of the cover 4' and the insulative housing 1' has at least one sliding groove 15' extending in a front-to-back direction, the other one has at least one sliding protrusion 45' which can be inserted into the sliding groove 15' and sliding along the sliding groove 15'.

Preferably, the insulative housing 1' has a pair of sliding grooves 15' on both sides thereof, the cover 4' has a pair of sliding protrusions 45' on both sides correspondingly. Each sliding protrusion 45' is protruding outwards from a main portion 41' of the cover 4' and has a locking portion 451' protruding on its outer side. Each side wall 113' of the insulative housing 1' defines a locking slot 116' to accommodate the corresponding locking portion 451', the locking portion 451' is stopped at its rear end by a stopping surface 1161' which confines the locking slot 116'.

Figure 14:
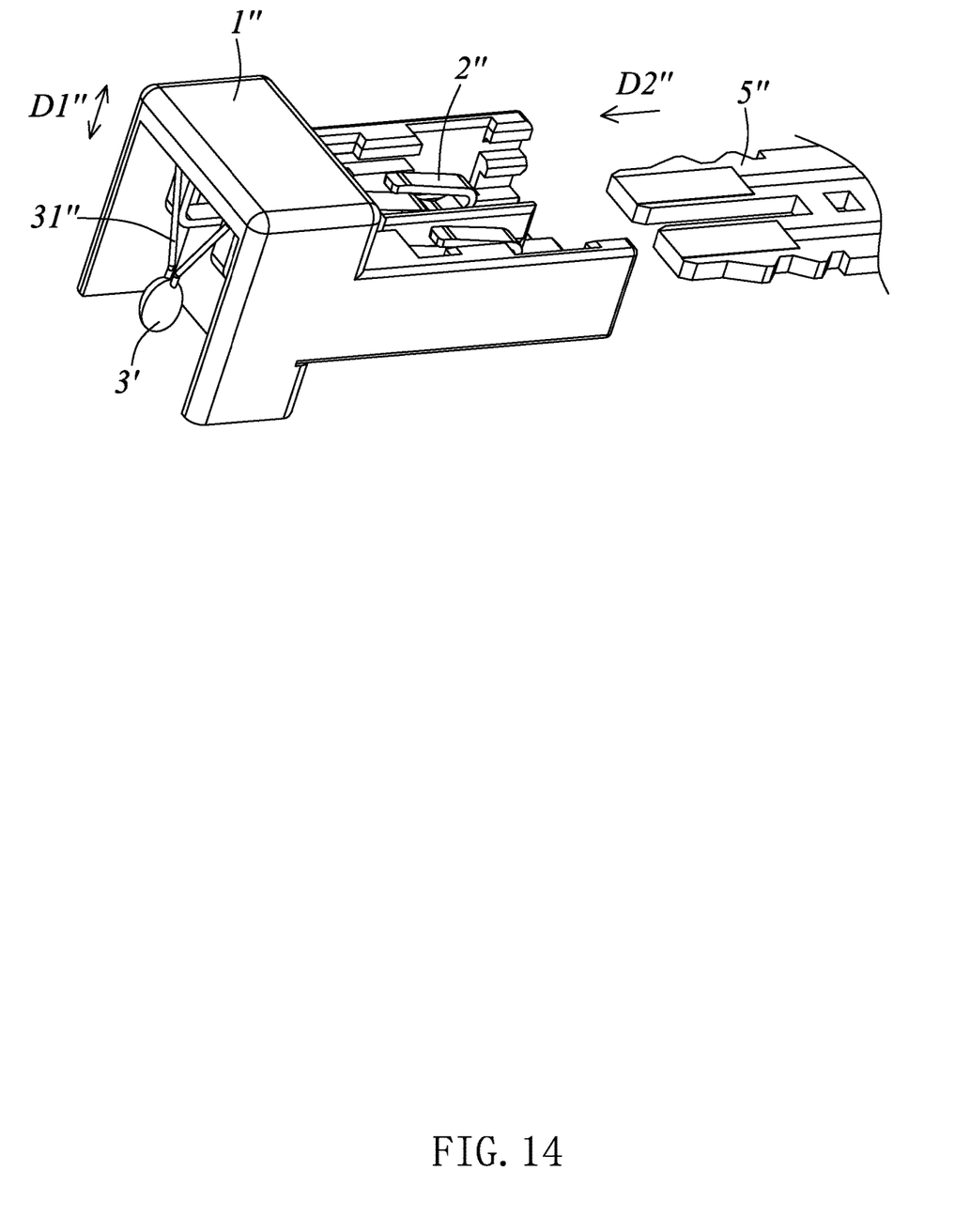
FIG. 14 is a partially exploded view of another electrical connector and a connecting element of the electrical connector assembly shown in FIG. 1.

Referring to FIG. 14, another electrical connector is an alternative embodiment of the temperature sensing connector, and the electrical connector is substantially similar to the electrical connector in aforementioned embodiment, and also comprises an insulative housing 1", a pair of contacts 2", a temperature sensing element 3" electrically connected with the contacts 2" and a cover (not shown) assembled to the insulative housing 1". A connecting element 5" is electrically connected with the contacts 2", and the difference is:

The temperature sensing element 3" is placed in a direction D1" perpendicular to an insertion direction D2" of the connecting element 5". Specifically, a plane in which a pair of pins 31" of temperature sensing element 3" located is a vertical plane, the insertion direction D2" of the connecting element 5" is perpendicular to the vertical plane.

Figure 15:
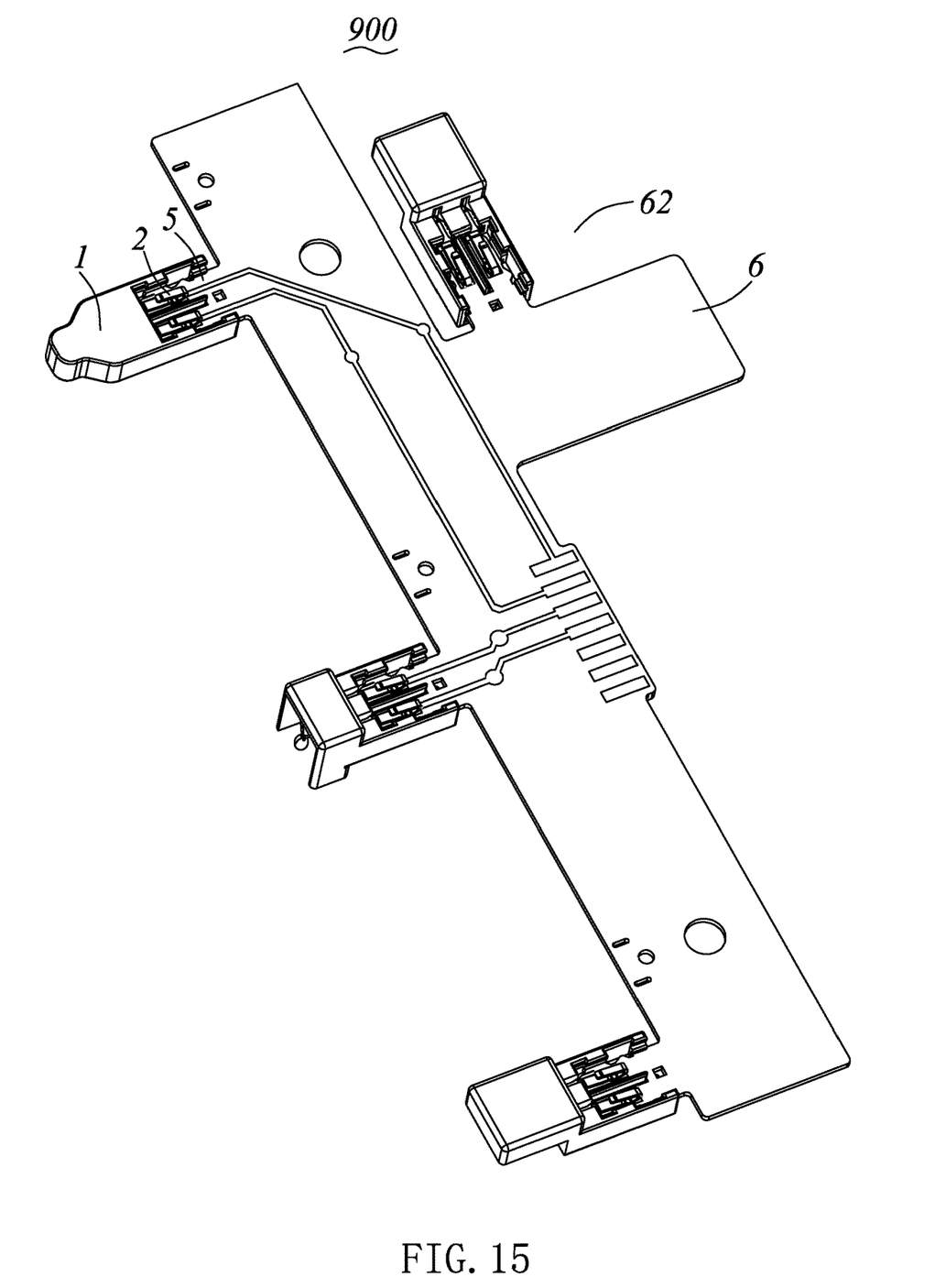
FIG. 15 is a perspective view of an electrical connector assembly in accordance with a second embodiment of the present disclosure.
Figure 16:
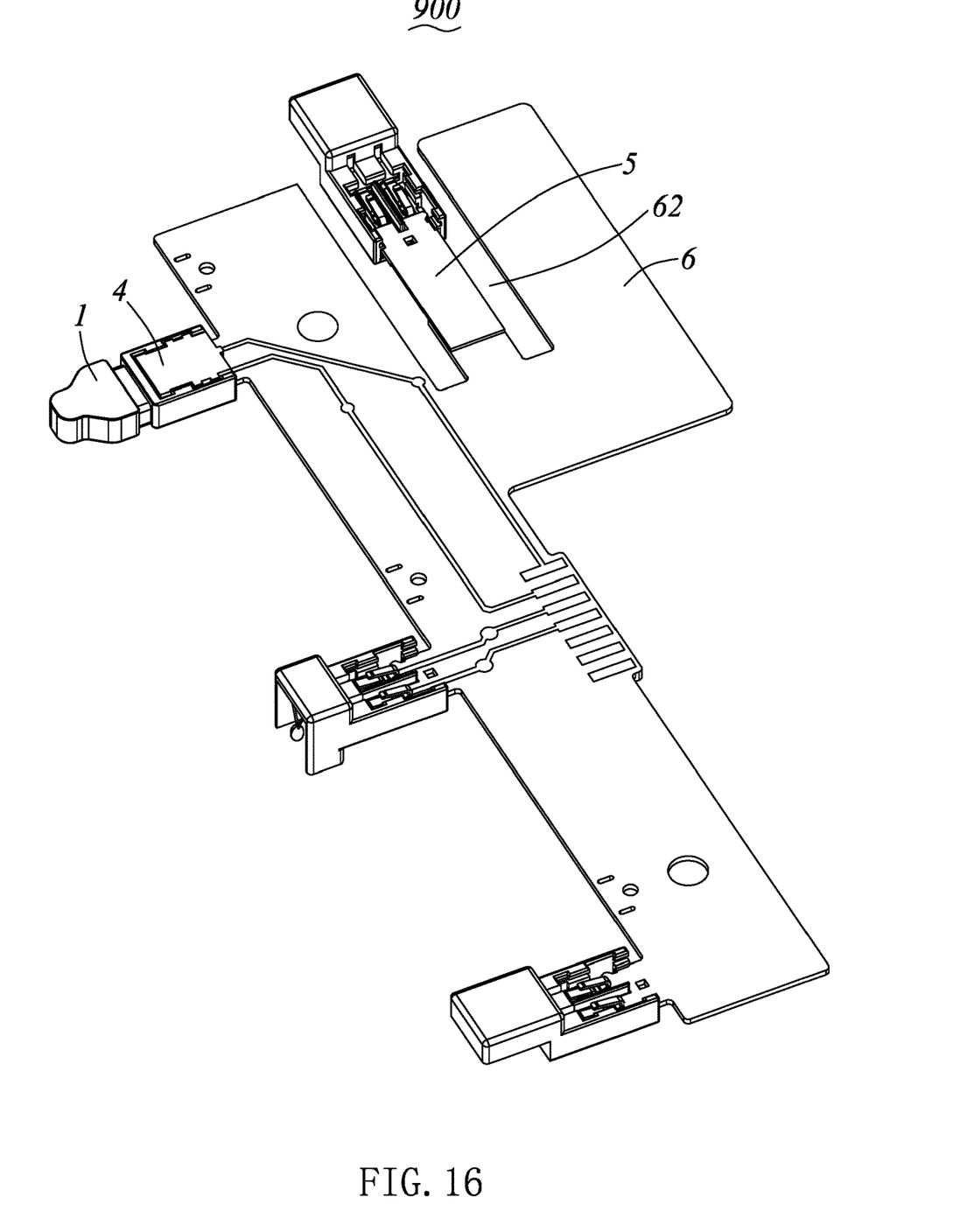
FIG. 16 is a perspective view of an electrical connector assembly in accordance with a third embodiment of the present disclosure.

As shown in FIGS. 1 and 15-16, the electrical connector assembly 900 further has a substrate 6 connected with the connecting elements 5, each temperature sensing connector is connected to one side of the substrate 6 by the connecting element 5, each temperature sensing connector and the substrate 6 are connected to opposite ends of the corresponding connecting element 5.

Every temperature sensing connector is attached to a side of the substrate 6 or at least partially received in a cutout 62 formed in a side portion of the substrate 6. Specifically, as shown in FIG. 1, in a first embodiment of the electrical connector assembly, the cutout 62 is formed on one side of the substrate 6, and the cutout 62 is opening towards one side in a plane in which the substrate 6 is located, that is to say, the cutout 62 is formed by walls of the substrate 6, and the walls are adjacent to each other and connected in a U-shape, one of the temperature sensing connectors is received in the cutout 62.

As shown in FIG. 15, in a second embodiment of the electrical connector assembly, a substrate 6 defines a cutout 62 on one side thereof, the cutout 62 is opening towards two sides in a plane which the substrate 6 is located, that is to say, the cutout 62 is formed by walls of the substrate 6 which are adjacent to each other and connected in an L-shape, and one of the temperature sensing connectors is received in the cutout 62.

Referring to FIGS. 1 and 15, in the first and second embodiments of the electrical connector assembly, the connecting element 5 is extending integrally outwards from a side edge 601 of the substrate 6, specially, the substrate 6 can be a printed circuit board (PCB), a flexible circuit board (FPC) or a flexible flat cable (FFC), the connecting element 5 and the substrate 6 are of a one-piece structure.

As shown in FIG. 16, in a third embodiment of the electrical connector assembly, a substrate 6 defines a cutout 62 on one side thereof, and the cutout 62 is opening towards one side in a plane in which the substrate 6 is located, one of the temperature sensing connectors and relative connecting element 5 are received in the cutout 62. Specially, the connecting element 5 is mechanically and electrically connected with the substrate 6, that is to say, the connecting element 5 and the substrate 6 are of a two-piece construction, and detachably connected to each other. In further, the connecting element 5 is flexible and can be a flexible circuit board (FPC) or a flexible flat cable (FFC), and the substrate 6 can be a printed circuit board (PCB), a flexible circuit board (FPC) or a flexible flat cable (FFC).

Similarly, other connecting elements 5 connected with other temperature sensing connector can be also removably connected to the substrate 6 and will not be described here.

As aforementioned, the substrate 6 of the electrical connector assembly 900 is connected with a plurality of temperature sensing connectors, as shown in FIG. 1, placement directions D1 of some temperature sensing elements 3 are parallel to the insertion directions D2 of its corresponding connection element 5; placement directions D3 of other temperature sensing elements 3 are perpendicular to the insertion directions D2 of its corresponding connection element 5.

In the electrical connector and electrical connector assembly 900, the temperature sensing element 3 is at least partially received in the cavity 120 of the insulative housing 1, and connecting with the contacting arm 23 of the contact 2 in the cavity 120, thereby facilitating disassembly and replacement of the faulty temperature sensing element 3.

It is to be understood, however, that even though numerous characteristics and advantages of preferred and exemplary embodiments have been set out in the foregoing description, together with details of the structures and functions of the embodiments, the disclosure is illustrative only; and that changes may be made in detail within the principles of present disclosure to the full extent indicated by the broadest general meaning of the terms in which the appended claims are expressed.

What is claimed is:

1. An electrical connector, comprising:
   an insulative housing defining a base portion and a receiving portion extending forwards from the base portion, the receiving portion having a cavity opening towards one side thereof;
   a pair of contacts accommodated in the insulative housing, each contact defining a retaining portion held in the base portion, a contacting arm provided at one end of the retaining portion and protruding into the cavity, and a mating arm provided at the opposite end of the retaining portion; and
   a temperature sensing element electrically connected with the contacts;
   wherein the temperature sensing element is at least partially received in the cavity and connecting with the contacting arms of the contacts in the cavity;
   wherein the base portion has an open portion opening outward and towards one side in a height direction thereof, the electrical connector further has a cover assembled to the open portion, the cover at least partially covers the contacts.

2. The electrical connector as claimed in claim 1, wherein the cover has a main portion and a plurality of stopping blocks provided at edges of the main portion, each stopping block extends downwardly from the edge of the main portion to make its bottom surface be located under a bottom surface of the main portion.

3. The electrical connector as claimed in claim 2, wherein the cover further has a rear stopping portion protruding downwardly from a rear edge of the main portion.

4. The electrical connector as claimed in claim 2, wherein the stopping blocks are disposed on both sides of the cover in a transverse direction, the stopping blocks on each side comprise at least one side stopping portion facing downwards.

5. The electrical connector as claimed in claim 1, wherein the cover is locked with the insulative housing, the cover and the insulative housing cover and fasten the contacts on both sides.

6. The electrical connector as claimed in claim 5, wherein the cover is assembled to the insulative housing along the height direction and fastened to side walls of the base portion by means of locking portions on both sides thereof.

7. The electrical connector as claimed in claim 5, wherein the cover is slidingly assembled to the insulative housing in a front-and-back direction, one of the cover and the insulative housing has at least one sliding groove extending in a front-to-back direction, the other one has at least one sliding protrusion which can be inserted into the sliding groove and sliding along the sliding groove.

8. The electrical connector as claimed in claim 1, wherein each contact further defines an abutting arm extending in a reversed direction from the mating arm, the cover is abutting against the abutting arm and therefore the mating portion of the mating arm having a tendency to move downwards.

9. The electrical connector as claimed in claim 1, wherein each contact further has a clamping arm extending from the retaining portion, and the clamping arm is curved and elastic, the mating arm and the clamping arm are spaced apart from each other and arching in opposite directions.

10. An electrical connector assembly comprising:
at least one temperature sensing connector, and the temperature sensing connector comprising:
an insulative housing having a pair of receiving slots for receiving corresponding contacts;
a pair of contacts retained in the insulative housing, and each contact having a retaining portion received in corresponding receiving slot, a contacting arm provided at one end of the retaining portion and a mating arm provided at the opposite end of the retaining portion; and
a temperature sensing element electrically connected with the contacts;
wherein the electrical connector assembly further has a connecting element electrically connected with the temperature sensing connector, and the connecting element is elastically contacting with the mating arm; the mating arm is curved and elastic, the insulative housing has a pair of receiving slots for receiving the corresponding contacts and a pair of mounting slots communicated with corresponding receiving slots, the connecting element is inserted into the mounting slots along a back-to-front direction and abutting against mating portions of the mating arms.

11. The electrical connector assembly as claimed in claim 10, wherein the electrical connector assembly further has a substrate connected with the connecting element, the temperature sensing connector is connected to one side of the substrate by the connecting element, the temperature sensing connector and the substrate are connected to opposite ends of the connecting element.

12. The electrical connector assembly as claimed in claim 11, wherein the temperature sensing connector is attached to one side of the substrate or at least partially received in a cutout formed in a side portion of the substrate.

13. The electrical connector assembly as claimed in claim 12, wherein the connecting element is extending integrally outwards from a side edge of the substrate or mechanically and electrically connected with the substrate.

14. The electrical connector assembly as claimed in claim 13, wherein when the connecting element and the substrate are of a two-piece construction, the connecting element is flexible.

15. The electrical connector assembly as claimed in claim 10, wherein the connecting element has a pair of mating tongues arranged side by side in a transverse direction and electrically connected with corresponding contacts, the mating tongues are inserted into corresponding mounting slots and separated from each other by a separating wall in the base portion, the mating tongues are abutting against between the insulative housing and the contacts.

16. The electrical connector assembly as claimed in claim 10, wherein a placement direction of the temperature sensing element is parallel or perpendicular to an insertion direction of the connecting element.

* * * * *